(12) United States Patent
Szuch

(10) Patent No.: US 8,545,931 B2
(45) Date of Patent: Oct. 1, 2013

(54) THIN LINE CONFORMAL COATING METHOD

(75) Inventor: Michael Szuch, Oceanside, CA (US)

(73) Assignee: Nordson Corporation, Westlake, OH (US)

( * ) Notice: Subject to any disclaimer, the term of this patent is extended or adjusted under 35 U.S.C. 154(b) by 503 days.

(21) Appl. No.: 12/426,572

(22) Filed: Apr. 20, 2009

(65) Prior Publication Data

US 2009/0202709 A1 Aug. 13, 2009

Related U.S. Application Data

(62) Division of application No. 11/558,022, filed on Nov. 9, 2006, now abandoned.

(60) Provisional application No. 60/829,049, filed on Oct. 11, 2006.

(51) Int. Cl.
*H05K 3/28* (2006.01)

(52) U.S. Cl.
USPC ............ 427/96.4; 427/421.1; 427/8; 118/300

(58) Field of Classification Search
USPC .......................... 427/8, 421.1, 96.4; 118/300
See application file for complete search history.

(56) References Cited

U.S. PATENT DOCUMENTS

| | | | |
|---|---|---|---|
| 3,870,233 A | 3/1975 | Wilhelm et al. | |
| 4,926,629 A * | 5/1990 | Eick et al. | 60/39.281 |
| 5,755,884 A | 5/1998 | Buckler et al. | |
| 5,795,390 A * | 8/1998 | Cavallaro | 118/314 |
| 5,954,030 A | 9/1999 | Sturman et al. | |
| 6,671,950 B2* | 1/2004 | Sturni et al. | 29/852 |
| 7,028,867 B2 | 4/2006 | Acum et al. | |
| 2005/0095367 A1* | 5/2005 | Babiarz et al. | 427/421.1 |

FOREIGN PATENT DOCUMENTS

| | | |
|---|---|---|
| CN | 1612675 A | 5/2005 |
| DE | 202004002167 U1 | 6/2004 |

OTHER PUBLICATIONS

The State Intellectual Property Office of the People'S Republic of China, Second Office Action in Chinese Application No. 200710180730.4, Feb. 13, 2012.

* cited by examiner

*Primary Examiner* — Timothy Meeks
*Assistant Examiner* — Nathan T Leong
(74) *Attorney, Agent, or Firm* — Wood, Herron & Evans, L.L.P.

(57) ABSTRACT

A coating system with an applicator that has an air cylinder with a needle valve. A control has a timer that provides a string of electrical pulses to a solenoid. With each pulse, the solenoid applies pressurized air to a cylinder piston, thereby opening the needle valve and permitting coating material to flow past the needle valve. The needle valve is closed for durations of time between pulses, and the coating material is ejected from a dispensing needle in response to closings of the needle valve.

13 Claims, 2 Drawing Sheets

THIN LINE CONFORMAL COATING METHOD

RELATED APPLICATIONS

This application is a divisional of application Ser. No. 11/558,022, filed Nov. 9, 2006 (pending) which claims the benefit of U.S. Provisional Application Ser. No. 60/829,049, filed Oct. 11, 2006, the disclosures of which are incorporated herein by reference in their entirety.

TECHNICAL FIELD

The present invention generally relates to applying conformal coating materials and more particularly, to an applicator for applying conformal coatings to electrical components.

BACKGROUND OF THE INVENTION

Conformal coating is the process of applying a dielectric material onto an electrical component, for example, a printed circuit ("PC") board or a device mounted thereon, to protect it from moisture, fungus, dust, corrosion, abrasion, vibration, chemicals, tin whiskers and other environmental stresses. Conformal coating materials range from solvent based materials that cure by evaporation of the solvent, to "100% solids" conformal coating materials. Common conformal coating materials include silicones, acrylics, urethanes, epoxy synthetic resins, paralyne and various polymers. When applied to PC boards, an insulative resin film of uniform thickness is formed as a solvent evaporates or, as a solvent free material is cured.

Automated selective coating systems are known which have conformal coating dispensers that dispense material in various patterns, with varying deposition accuracies and producing coatings with varying thicknesses. For instance, a dispenser may dispense material in the form of a straight bead, a bead that is continuously rotated in a curved or circular pattern, and/or a bead that is subsequently atomized. Beads tend to produce coatings that are generally thicker than those for atomized sprays. Furthermore, depending on material viscosities as well as material/board surface tension interactions, a bead deposited on a board may spread to locations where no coating is desired. Moreover, in atomized sprays, injecting a supply of material with pressurized air to achieve atomization often creates significant overspray, thus depositing atomized droplets outside a target area.

These current dispensing methods have features that in some applications lead to undesirable coating results including greater than desirable minimum coating areas and less than desirable edge definition capability. With more recent conformal coating applications, it is desirable to have a capability of coating even smaller areas or smaller geometries. This capability, however, primarily depends on the type of dispenser used to apply the coating material and perhaps more specifically, the control a dispenser provides over the dispensed material.

With current dispensers that dispense beads or atomized sprays, there is a limit to which the size of the wetted area, or contact area of the bead or spray on a component, can be minimized. As a result, such current dispensers have minimum coating areas, i.e., an area where it is practical to use such a dispenser for conformal coating applications, which may be too large for more current applications. This becomes even more significant as boards and components get smaller and component densities on such boards increase.

Known needle valve dispensers control dispensing of a conformal coating material by controlling a time that a needle valve is open as well as an applied pressure of the conformal coating material being supplied to the needle valve. Such known needle valve dispensers also have some short comings, for example, first, it is difficult to control a flow of lower viscosity conformal coating materials. While there is no standard measure that distinguishes lower viscosity materials from higher viscosity materials, as an example, lower viscosity materials include but are not limited to materials that have viscosities that are less than one thousand centipoise. In order to reduce splash of lower viscosity materials through known needle valve dispensers, the dispensing tip must be maintained as close to the surface of the substrate as possible, for example, within several millimeters ("mm"). On PC boards that are densely populated, the requirement that the dispensing tip be maintained so close to the substrate surface may severely limit the application of known needle valve dispensers. Second, the inability of known needle valve dispensers to sharply cutoff a flow of conformal coating material results in dripping, drooling, poor flow control and generally, a less precise application. For example, the coating material can only be applied to within about 0.060 inch ("in") or about 1.5 mm of a keep-out area, that is, an area where no conformal coating material is to be applied. Third, known needle valve dispensers have an inherent problem of allowing coating materials to cling to, and partially cure on, the dispensing tip, which leads to clogs and may reduce the repeatability and accuracy of the dispensing process.

Therefore, there is a need to provide an improved needle valve conformal coating applicator that improves the accuracy and selectivity of material deposition in a conformal coating process.

SUMMARY OF THE INVENTION

The present invention provides a coating system with a needle valve applicator that may apply lower viscosity conformal coating materials to a substrate with greater accuracy, precision and/or speed than known needle valve applicators and/or may have other advantages. For example, the coating system of the present invention may improve the ability of a needle valve applicator to apply coating material closer to keep-out areas, and/or apply thinner lines of coating material, and/or operate higher above a substrate while maintaining a desired accuracy in the placement of the conformal coating material on the substrate. Such improved coating system performance often eliminates masking and unmasking, thereby substantially reducing handling of the substrate.

In addition, a coating system of the present invention can provides a needle valve applicator that cleanly ejects coating material from a dispensing needle, thereby preventing the coating material from clinging to, and/or curing on, the dispensing needle. This reduces maintenance and minimizes clogs while maintaining accuracy and increasing repeatability. Further, the coating system of the present invention may allow for coating material discharge volumes that are predictable and repeatable; and therefore, a total volume of conformal coating material applied over an area may be precisely controlled. Such a capability can substantially reduce waste of the conformal coating material. The coating system of the present invention may provide a needle valve applicator that has a slim profile and thus, can be moved through small spaces between components on PC boards at lower dispense heights, which minimizes splashing when coating with lower viscosity materials. All of the features above can make the coating system of the present invention especially useful when applying a conformal coating material to smaller, densely populated PC boards.

More specifically, in one exemplary embodiment, the invention provides a coating system with a applicator that has an air cylinder operated by a solenoid connected to pressurized air. A needle valve mounted in the cylinder is opened by the solenoid applying pressurized air to a piston connected to the needle valve. A control has a timer that is operable to provide a string of electrical pulses to the solenoid. With each pulse, the solenoid applies the pressurized air to the piston, thereby opening the needle valve and permitting coating material to flow past the needle valve. The needle valve is closed for durations of time between pulses, and the coating material is ejected from a dispensing needle in response to closings of the needle valve.

In further aspects of this invention, the timer is a pulse width modulator; and the needle valve is repeatedly opened for durations about equal to an On time stored in the control. The needle valve is closed by a return spring and held closed for durations of time between the pulses.

In another exemplary embodiment, the invention provides a method of automatically dispensing a coating material onto a substrate with an applicator being movable by a programmable control operating a positioner supporting the applicator. The applicator has a flow channel conducting a coating material from a needle valve to a dispensing needle. The needle valve is movable to an open position by an air cylinder piston in response to a pressurized fluid received from a solenoid, and the needle valve is then movable to a closed position. The method includes applying a string of electrical pulses to the solenoid. The coating material is moved past the needle valve by repeatedly opening the needle valve in response to each pulse in the string of electrical pulses being applied to the solenoid. The coating material is ejected from the dispensing needle by repeatedly closing the needle valve in response to periods of time between pulses in the string of electrical pulses.

These and other objects and advantages of the present invention will become more readily apparent during the following detailed description taken in conjunction with the drawings herein.

DETAILED DESCRIPTION OF THE ILLUSTRATIVE EMBODIMENTS

Figure 1:
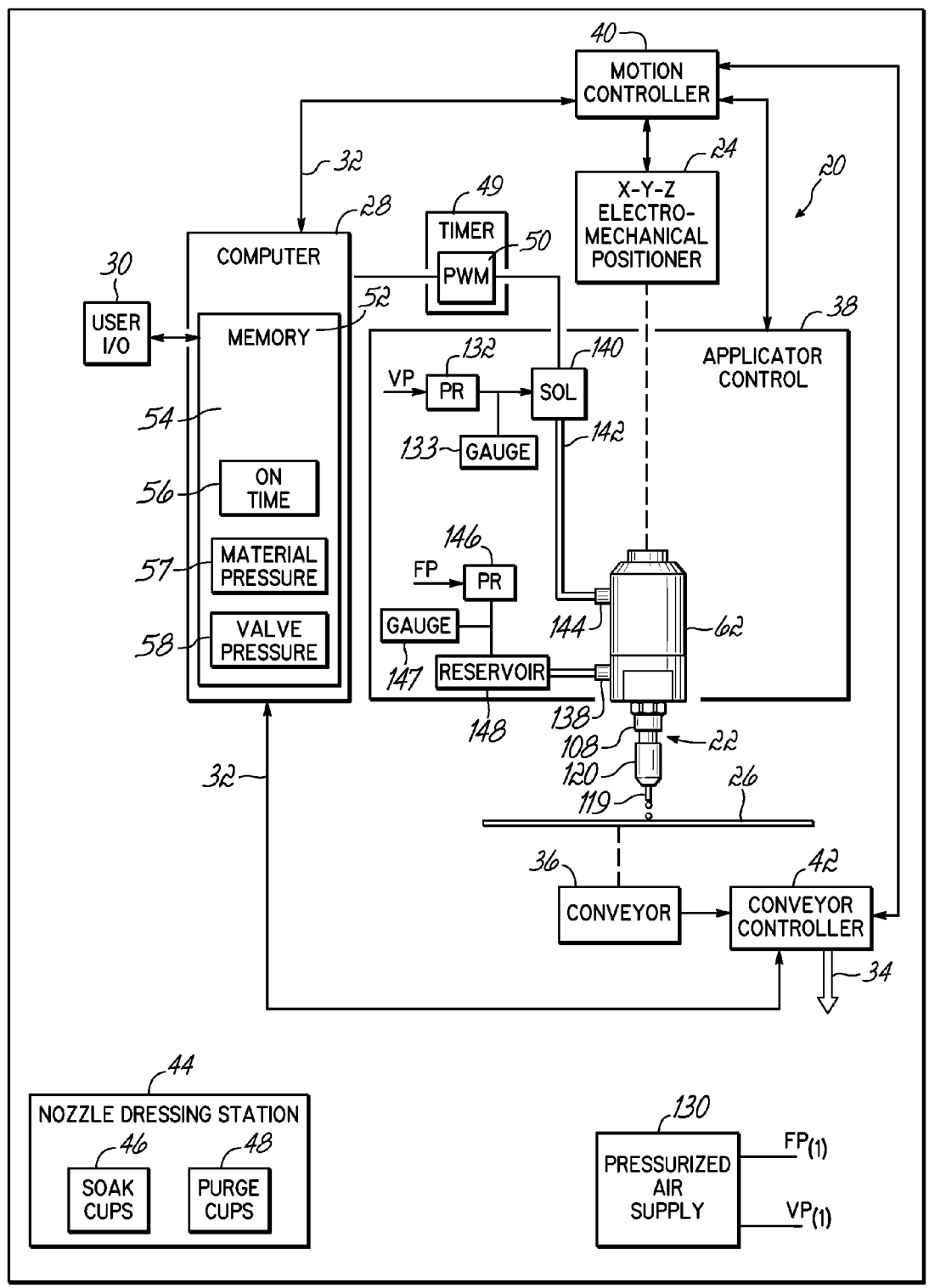
FIG. 1 is a schematic block diagram of one exemplary embodiment of a computer controlled conformal coating system.

Referring to FIG. 1, one exemplary example of a conformal coating system 20 includes a conformal coating applicator or dispenser 22 mechanically suspended from an X-Y-Z positioner 24. The X-Y-Z electro-mechanical positioner 24 includes a drive coupled to independently controllable motors (not shown) in a known manner. The X-Y-Z positioner 24 is capable of rapidly moving the conformal coating applicator 22 with respect to a substrate 26.

A computer 28 may be a programmable logic controller ("PLC"), a microprocessor based controller, a hardened personal computer or other conventional programmable control device capable of carrying out the functions described herein as will be understood by those of ordinary skill. A user I/O 30, for example, a visual display device such as an LCD screen (not shown) and a user input device such as a keyboard (not shown) are connected to the computer 28 in a known manner. The computer provides outputs to a timer 49, for example, a pulse width modulator ("PWM") 50, that, in turn, is electrically connected to, and drives, an air solenoid 140. The PWM 50 creates a series or string of electrical control pulses that are used to operate the solenoid 140 and hence, the conformal coating applicator 22.

The computer 28 has a memory 52 for storing operating programs and programmed instructions in a known manner. The memory further includes On time storage 54 and Cycle time storage 56. The On time storage stores at least one desired value of an On time of a pulse in a pulse string created by the PWM 50. The Cycle time storage stores at least one desired value of a respective total Cycle time associated with the On time of the pulse. Thus, a pulse Off time is determined by subtracting a stored On time from a stored respective Cycle time.

The coating system 20 is provided with one or more standard RS-232 busses 32 and one or more SMEMA communications busses 34, which are compatible with most types of other automated equipment utilized in substrate production assembly lines. The motion controller 40 and a conveyor controller 42 are in electrical communications with the computer 28 and with each other. Thus, a system control includes the computer 28, the PWM 50, the motion controller 40, the applicator control 38 and the conveyor controller 42, if used.

The substrate 26, for example, a PC board, onto which a conformal coating is to be applied, is supported in an operative relationship with the conformal coating applicator 22 in a known manner. Depending on the application, one or more substrates 26 may be coated in a batch mode; or optionally, the substrates 26 may be moved continuously past the applicator 22 by a conveyor 36. The conveyor 36 is of a conventional design and has a width which may be adjustable to accept PC boards of different dimensions. The conveyor 36 may also include pneumatically operated stop and locate mechanisms, and the conveyor 36 is operated by a conveyor controller 42 in a known manner.

The exemplary embodiment may further include a nozzle dressing station 44 that includes one or several soak cups 46, a purge cup 48 and/or other nozzle dressing tools that can be used to clean an applicator tip in a known manner depending on the specific properties of the conformal coating used.

Figure 2:
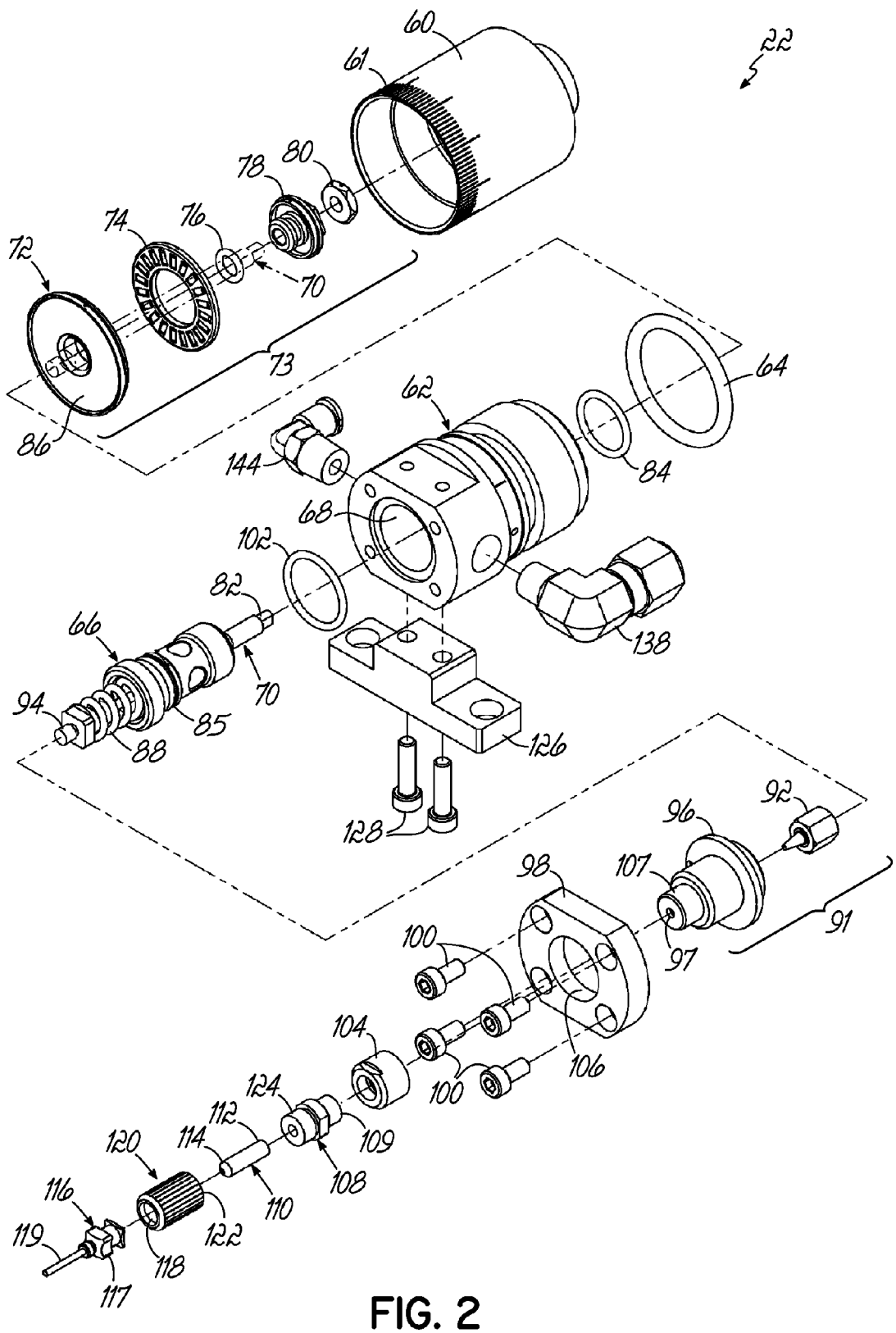
FIG. 2 is a disassembled view of an exemplary embodiment of a conformal coating applicator used in the conformal coating system of FIG. 1.

Referring to FIG. 2 the conformal coating applicator 22 has a packing cartridge 66 that supports a piston rod 70, which is inserted into a bore 68 of an air cylinder body 62. An air cylinder piston 72, thrust bearing 74, O-ring 76 and lock nut seal 78 are then mounted on the piston rod 70. A lock nut 80 is then threaded onto a piston rod end 82 to secure the air cylinder piston 72, thrust bearing 74, O-ring 76 and lock nut seal 78 onto the piston rod 70 to form a unitary piston assembly 73 with respect to the air cylinder 62. O-ring 76 seals the packing cartridge 66 within the air cylinder 62. O-ring 85 seals the pressurized coating material within the cylinder bore 68, and O-ring 84 seals the pressurized air within the cylinder bore 68. An air cylinder cap 60 is threadedly mounted on the air cylinder 62 with an O-ring 64 providing a seal resistance to rotation of the cap 60. A mounting bracket 126 is attached to the air cylinder 62 by fasteners 128, and the mounting bracket 126 may be used to mount the applicator 22 to the positioner 24 of FIG. 1.

The piston assembly 73 is moveable lengthwise with respect to the packing cartridge 66. In response to a pressurized air applied against a surface 86 of piston 72, the piston assembly 73 moves to the right as viewed in FIG. 2, which motion compresses a return spring 88 that is secured over the piston rod 70 by a nut 94. Upon the pressurized air being removed from the pneumatic piston 72, the return spring 88 returns the piston assembly 73 to its original longitudinal position with respect to the air cylinder 62.

A needle valve 91 has a needle 92 and a mating seat 96. The needle 92 is threaded onto an opposite piston rod end 94 and thus, is movable by the piston assembly 73. A seat 96 is mounted to one end of the air cylinder 62 by a mounting plate or cap 98 that is secured by a fasteners 100. An O-ring 102 provides a fluid seal between the seat 96 and the air cylinder 62. Thus, when assembled, the air cylinder bore 68 is bounded at one end by the air cylinder piston 72; and the bore 68 is bounded at an opposite end by the seat 96. Further, the bore 68 is fluidly coupled via connector 144 to pressurized air that fills the bore 68 between the O-ring 84 and the piston 72. The bore 68 is also fluidly coupled via connector 138 to a pressurized source of conformal coating material that fills the bore 68 between the O-ring 85 and seat 96. The seat 96 has a flow channel 97 through which the conformal coating material passes when the needle valve 91 is open. The air cylinder cap 60 has a scale marked on its circumference, and rotating the cap 60 provides a microadjustment of a positive stop that limits a displacement of the piston assembly 73 and hence, the needle 92 when the needle valve 91 is opened. Thus, the air cylinder cap 60 provides a control of conformal coating material through the needle valve 91.

A nozzle adaptor 104 extends through a bore 106 of the mounting cap or plate 98 and is threaded onto one end 107 of the seat 96. A holder 108 has one end 109 threaded into the nozzle adaptor 104. A capillary tube 110 has one end 112 threaded into the holder 108. A dispensing needle 116 is inserted into an end 122 of a retaining nut 120, which has a larger bore that accepts a hub 117 of the dispensing needle 116. Thus, only a tip 119 of the dispensing needle 116 extends through a smaller bore at an opposite end 118 of the retaining nut 120. An opposite end 114 of the capillary tube 110 slides into a bore of a dispensing needle 116, and the retaining nut end 122 is threaded to an end 124 of the holder 108, thereby securing the dispensing needle 116 to the applicator 22.

Referring back to FIG. 1, in this exemplary embodiment, a pressurized air supply 130 provides an air pressure VP, for example, a shop air pressure, to a pressure regulator 132 that may be mounted on the conformal coating applicator 22. A gage 133 monitors the regulated air pressure applied to a solenoid 140, and an air line 142 conducts the regulated pressurized air from the solenoid 140 to an air fitting 144 connected to the air cylinder body 62. The pressurized air supply 130 further provides an air pressure FP to a pressure regulator 146 that may be mounted on the positioner 24 and thus, does not move with the applicator 22. A gage 147 monitors the regulated air pressure that is applied to a liquid reservoir 148. The liquid reservoir 148 may be a syringe of conformal coating material that is commercially available from a supplier, the regulated air pressure from the pressure regulator 146 may be applied to a plunger located in one end of the syringe. Thus, the liquid reservoir 148 supplies a pressurized conformal coating material to the air cylinder 62. The pressure regulator may be adjusted to change the pressure of the conformal coating material supplied from the reservoir 148 to the air cylinder 62.

In operation, prior to initiating a conformal coating application cycle, a user must set up the coating system 20 for a particular application. In that process, desired values for system variables are determined; and those desired values are often application dependent. For example, desired values for system variables may depend on the conformal coating material being used, its viscosity, the specifications of the conformal coating as applied to the substrate, current environmental conditions, desired applicator velocity and similar factors. One variable value that the user may select is a general size of droplet to be applied by the dispensing needle 116. Dispensing needles may be selected that have respective internal flow paths of different diameters; and hence, larger dispensing needles may be chosen to provide larger droplets and smaller dispensing needles may be chosen when smaller droplets are desired.

The user may also determine a PWM On time, a PWM Cycle time and a desired material flow through the needle valve 91. Again, the desired values for those variables are application dependent. The material flow through the needle valve 91 may be adjusted by turning or microadjusting the air cylinder cap 60 shown in FIG. 2, which is effective to adjust the open position or stroke of the needle 92. Material flow through the needle valve 91 may also be varied by changing the pressure on the conformal coating material by adjusting regulated air pressure from the pressure regulator 146. Often, a number of test substrates are coated, and the variables adjusted until a desired coating application is obtained. The positioning program provided by the motion controller 40 may also be changed depending on various setup factors, for example, how high the dispensing tip 119 can be raised from the substrate 26 and still provide a conformal coating within specifications.

For given conformal coating materials, a table of starting default values of regulated air pressures from pressure regulator 146, air cylinder cap adjustments and On time and Cycle time values may be stored in memory 50 of the computer 28. The user I/O 30 may be used to set and adjust the values in the On time storage 54 and the Cycles time storage 56. In one exemplary embodiment, the gages 133, 147 may have visual displays and the pressure regulators 132, 146 may be manually adjustable. However, in another exemplary embodiment, the gages 133, 147 may provide respective pressure feedback signals to the computer 28; and the pressure regulators 132, 146 may have inputs permitting the computer 28 to change and set the respective regulated pressures. Further, the memory 52 may provide On time storage 54, Cycle time storage 56, regulated coating material pressure storage 57 and regulated valve pressure storage; and the values stored in the memory 52 may be set and/or changed by the user operating the user I/O 30.

After the On time, Cycle time, coating material air pressure and needle valve open position are set, the user I/O may be used to initiate an automatic cycle of operation. Data representing a desired dispensing cycle is stored in the memory 50 of the computer 28 that, in turn, communicates control signals to the motion controller 40. The motion controller 40 commands the X-Y-Z positioner 24 to move the applicator 22 to desired locations with respect to the substrate 26. When it is desirable to apply a conformal coating to the substrate 26, the motion controller 40 provides a command signal to the computer 28 that, in turn, operates the PWM 50 with the desired On times and Cycle times. During each On time, the PWM 50 provides a pulse to the solenoid 140 causing it to change state and apply a regulated valve air pressure to piston surface 86 (FIG. 2). The valve air pressure causes the piston assembly 73 and needle 92 to overcome the biasing force of the piston return spring 88 and move to the right as viewed in FIG. 2. That motion displaces the needle 92 away from the seat 96, thereby opening the needle valve 91 for a duration of the On time. While the needle valve 91 is open, conformal coating material may flow through a downstream flow path, that is, a flow path through the seat flow channel 97, the holder 108, the capillary tube 110 and the dispensing needle 116. In many applications, the coating material pressure and needle open position are set, so that when the needle valve 91 is open, a volume of conformal coating material flows past the needle valve 91, which is about equal to the volume of conformal coating material most recently ejected from the dispensing needle 116. At the end of the On time, the solenoid 140 switches back to its original state; and the valve air pressure is removed from the air cylinder piston 72.

The time between two pulse On times is defined as a pulse Off time; and during the pulse Off time, the piston return spring 88 rapidly moves the piston 72 and needle 92 to the left, as viewed in FIG. 2, until the needle 92 again engages the seat 96, thereby closing the needle valve 91 and terminating the flow of conformal coating material past the needle valve 91. However, the rapid return action of the needle 92 creates a pressure spike in the downstream flow path, which causes a droplet of conformal coating material to be sharply discharged from the dispensing needle 116. Further, the pressure spike is effective to cleanly eject the droplet of conformal coating material from the dispensing needle tip 119, thereby substantially preventing conformal coating material from clinging to the dispensing needle 116. At the end of the Cycle time, the computer 28 again operates the PWM 50 to produce a pulse to the solenoid 140 with the desired On time.

The PWM 50 provides a stream or string of pulses rapidly opens and closes the needle valve 91 over very short time periods to eject droplets of conformal coating material from the dispensing tip 119. The droplets may be dispensed close to each other so that they stitch together to form a line of conformal coating material, and the lines can be dispensed close to each other to apply the conformal coating material over an area. The net result is a conformal coating system that applies lower viscosity conformal coating materials to a substrate with greater accuracy, precision and speed than known needle valve applicators. For example, using the PWM 50 permits the applicator 22 to apply a conformal coating material to within about 0.040 in (1 mm) of a keep-out area and apply a coating material in line widths that are about 0.050 in (1.2 mm) wide with highly distinctive edges. Further, in some applications, the dispensing tip 119 may be elevated up to about 0.480 in (12 mm) above the substrate 26 while maintaining a desired accuracy in the placement of the conformal coating material on the substrate. Such improved performance often eliminates masking and unmasking, thereby substantially reducing handling of the substrate 26. Further, such improved performance often permit the applicator 22 to be moved at higher velocities and through conformal coating cycles that take less time and are more efficient than coating cycles executed with known needle valve applicators.

In addition, the rapid pulsing of the needle valve in the conformal coating system causes the droplets of conformal coating material to be ejected cleanly from the dispensing needle tip, thereby preventing conformal coating material from clinging to, and/or curing on, the dispensing needle tip 119. This reduces maintenance and minimizes clogs while maintaining accuracy and increasing repeatability. The dispensing of droplets by the needle valve 91 provides a droplet volume that is predictable and repeatable; and therefore, the volume of conformal coating material applied over an area can be precisely controlled by the computer 28 and motion controller 40. The motion controller 40 may be used to control the velocity of the applicator 22. The computer 28 may be used to control material flow by appropriate selection of an On time and/or selecting a number of times that the PWM 50 cycles the needle valve 91 while the applicator 22 is moving over an area of the substrate 26. Such a capability substantially reduce waste of the conformal coating material.

Further, the conformal coating system provides a slim profile for the holder 108, the retaining nut 120 and the dispensing needle tip 119, which permits the applicator 22 to moved through small spaces between components on PC boards at lower dispense heights. This design optimizes dispensing selectivity when coating with lower viscosity materials. All of the features above make the conformal coating system 10 shown and described herein especially useful when applying a conformal coating material to smaller and densely populated PC boards.

While the present invention has been illustrated by a description of various embodiments and while these embodiments have been described in considerable detail, it is not the intention of Applicants to restrict or in any way limit the scope of the appended claims to such detail. Additional advantages and modifications will readily appear to those skilled in the art. For example, in the exemplary embodiments shown and described, the timer 49 is a PWM 50. However, in other embodiments, other timing circuits or devices may be used that are operative to provide a string of pulses to the solenoid 140, wherein the time the solenoid 140 is operated to hold the needle valve 91 open is adjustable. Further, in the exemplary embodiments, the timer 49 is shown as a separate component. In other embodiments, the timer 49 may located anywhere that is appropriate for the design. For example, the timer 49 may be a stand-alone programmable or nonprogrammable device, or be a programmable or nonprogrammable component integrated into the I/O of the computer 28 or the motion controller 40, or be implemented in software in the computer 28 or the motion controller 40.

In the exemplary embodiments shown and described, the On time of the PWM 50 is used to operate the solenoid 140 to hold the needle valve 91 open. However, in other embodiments, an Off time of the PWM 50 may be used. In the exemplary embodiments shown and described, the PWM On time and Cycle time are adjustable by a user and stored in a memory 52. In other embodiments, the Cycle time may be fixed and only the On time may be adjustable and stored. In still further embodiments, only the Off time may be adjustable and stored; or the On time and the Off time may be adjustable and stored; or the Off time and the Cycle time may be adjustable and used.

In the exemplary embodiments shown and described, a pressurized air supply 130 is used to drive the solenoid 140 and apply a regulated pressure to the reservoir 148. In other embodiments, other pressurized fluids or gases may be used instead of air. Further, while the exemplary embodiments describe an application of a conformal coating to a substrate 26, the coating system 10 may be used to apply other coating materials to the substrate 26.

In the exemplary embodiments shown and described, the coating system 10 has a control that utilizes motion controller 40 and computer 28; however, in other embodiments, the control functions discussed herein may be implemented using fewer or more programmable controllers or devices that may be in different locations. Often, application requirements and the availability of resources at different facilities will require different control configurations.

In the exemplary embodiments shown and described, a return spring 88 is used to close the needle valve 88; however, in an alternative embodiment, the air cylinder 62 may be a double acting cylinder and operable to move the needle 92 to a closed position.

Therefore, the invention in its broadest aspects is not limited to the specific remote conveyor belt monitoring system details shown and described. Consequently, departures may be made from the details described herein without departing from the spirit and scope of the claims which follow.

What is claimed is:

1. A method of dispensing a discrete line of conformal coating material onto a predetermined area of a substrate with an applicator operatively coupled to a programmable control and a positioner, the applicator including a needle valve coupled to an actuator for opening and closing the needle valve based on signals from a timing device to dispense a supply of the conformal coating material pressurized by air from a pressure regulator, the applicator also including a capillary tube located downstream from the needle valve and a dispensing needle located downstream from the capillary tube and having a needle tip, the method comprising:

selecting a size of the dispensing needle to set a desired droplet size for the conformal coating material that will release from the needle tip of the dispensing needle;

selecting an air pressure delivered by the pressure regulator to set a desired fluid pressure of the conformal coating material at the needle valve;

selecting a stroke length of the needle valve to set a desired flow rate of the conformal coating material through the needle valve;

selecting an On time and a Cycle time for the timing device to set a desired pulse rate of the needle valve, the On time defining a duration of each pulse applied by the timing device and the Cycle time defining a duration between the beginning of consecutive pulses applied by the timing device;

selecting a speed of the positioner to set a desired movement velocity of the applicator; and actuating the positioner and the timing device with the programmable control such that the applicator moves at the desired movement velocity while the timing device applies a string of electrical pulses at the desired pulse rate to the actuator, which opens and closes the needle valve for each electrical pulse, thereby ejecting droplets of conformal coating material through the capillary tube and the dispensing needle, wherein the desired droplet size, the desired flow rate, the desired fluid pressure, the desired pulse rate, and the desired movement velocity collectively cause the ejected droplets to coalesce into the discrete line located accurately within the predetermined area of the substrate.

2. The method of claim 1, wherein the timing device is a pulse width modulator, and actuating the timing device further comprises:

generating the string of electrical pulses with the pulse width modulator.

3. The method of claim 1, wherein the programmable control communicates with a computer memory, and the method further comprises:

storing a default setting for the size of the dispensing needle, the air pressure delivered by the pressure regulator, the stroke length of the needle valve, the On time and the Cycle time, and the speed of the positioner for a plurality of conformal coating materials in the computer memory; and applying the default setting to the programmable control based on the conformal coating material selected.

4. The method of claim 1, wherein the conformal coating material comprises a dielectric material, the substrate comprises an electronic component including at least two circuit elements separated by a clearance including the predetermined area, and actuating the positioner further comprises:

moving the applicator along the electronic component such that the needle tip moves through the clearance between the circuit elements.

5. The method of claim 1, further comprising:

selecting the size of the dispensing needle such that the dispensing needle includes an elongate internal flow path having a diameter configured to dispense droplets having the desired droplet size.

6. The method of claim 1, wherein the actuator comprises a solenoid and a piston connected to the needle valve within an air cylinder, and the method further comprises:

delivering pressurized air to force the piston to open the needle valve in response to each electrical pulse being applied to the solenoid.

7. The method of claim 6, wherein the actuator further comprises an air cylinder cap limiting the movement of the piston, and selecting a stroke length of the needle valve further comprises:

moving the air cylinder cap to a position corresponding to the stroke length for the desired flow rate.

8. The method of claim 6, wherein the actuator further comprises a solenoid pressure regulator delivering pressurized air to the solenoid and a pressure gage indicating the air pressure being delivered by the solenoid pressure regulator, and the method further comprises:

adjusting the solenoid pressure regulator manually to modify the air pressure being delivered to the solenoid.

9. The method of claim 1, wherein the pressure regulator includes a pressure gage indicating the air pressure being delivered by the pressure regulator to the conformal coating material, and the method further comprises:

adjusting the pressure regulator manually to modify the air pressure being delivered to the conformal coating material.

10. The method of claim 1, wherein closing the needle valve for each electrical pulse further comprises:

accelerating the droplet of conformal coating material downstream of the needle valve to jet the droplet through the capillary tube and the needle tip of the dispensing needle.

11. The method of claim 1, wherein the dispensing needle defines an elongate tube terminating in the needle tip.

12. The method of claim 1, wherein the dispensing needle includes a bore and the capillary tube is received in the bore.

13. The method of claim 1, wherein the applicator further includes a nozzle adapter coupled with the needle valve and a holder coupled with the nozzle adapter, the capillary tube being positioned between the holder and the dispensing needle.

* * * * *